(12) United States Patent
Li

(10) Patent No.: US 12,100,700 B2
(45) Date of Patent: Sep. 24, 2024

(54) LIGHT-EMITTING DIODE PANEL AND SPLICED PANEL

(71) Applicants: HUIZHOU CHINA STAR OPTOELECTRONICS DISPLAY CO., LTD., Huizhou (CN); TCL CHINA STAR OPTOELECTRONICS TECHNOLOGY CO., LTD., Shenzen (CN)

(72) Inventor: Yan Li, Huizhou (CN)

(*) Notice: Subject to any disclaimer, the term of this patent is extended or adjusted under 35 U.S.C. 154(b) by 0 days.

(21) Appl. No.: 17/599,568

(22) PCT Filed: Jul. 29, 2021

(86) PCT No.: PCT/CN2021/109191
§ 371 (c)(1),
(2) Date: Sep. 29, 2021

(87) PCT Pub. No.: WO2023/000369
PCT Pub. Date: Jan. 26, 2023

(65) Prior Publication Data
US 2024/0047442 A1 Feb. 8, 2024

(30) Foreign Application Priority Data
Jul. 22, 2021 (CN) .......................... 202110829314.2

(51) Int. Cl.
*H01L 25/16* (2023.01)
*H01L 33/62* (2010.01)

(52) U.S. Cl.
CPC ............ *H01L 25/167* (2013.01); *H01L 33/62* (2013.01)

(58) Field of Classification Search
CPC ... H01L 25/167; H01L 33/62; H01L 25/0753; G09F 9/33; G09F 9/3026
See application file for complete search history.

(56) References Cited

U.S. PATENT DOCUMENTS

| 2018/0033800 A1 | 2/2018 | Koide |
| 2020/0211929 A1* | 7/2020 | Son .................... G09F 9/3026 |

(Continued)

FOREIGN PATENT DOCUMENTS

| CN | 1291351 A | 4/2001 |
| CN | 101458428 A | 6/2009 |

(Continued)

OTHER PUBLICATIONS

International Search Report in International application No. PCT/CN2021/109191, mailed on Mar. 28, 2022.

(Continued)

*Primary Examiner* — Victor A Mandala

(57) ABSTRACT

A light-emitting diode panel and a spliced panel are disclosed. In the light-emitting diode panel, a substrate includes a first area and a second area, and the substrate is provided with a plurality of through-holes defined in the first area or the second area; conductors are disposed in the through-holes; light-emitting units correspond to the first area, and one of the light-emitting units includes at least one light-emitting diode; first wirings connect the at least one light-emitting diode to the conductors; a flexible circuit board is disposed on a back side of the substrate; and second wirings connect the conductors to the flexible circuit board.

20 Claims, 6 Drawing Sheets

(56) References Cited

U.S. PATENT DOCUMENTS

| | | | |
|---|---|---|---|
| 2020/0350476 A1* | 11/2020 | Lee | G02B 27/0006 |
| 2020/0359499 A1* | 11/2020 | Hwu | H10K 59/131 |
| 2020/0388636 A1* | 12/2020 | Yueh | H01L 27/124 |
| 2021/0134775 A1* | 5/2021 | Liu | H01L 27/1218 |
| 2021/0376209 A1* | 12/2021 | Wang | H01L 25/0753 |
| 2021/0384179 A1* | 12/2021 | Bok | H10K 59/352 |
| 2022/0263000 A1* | 8/2022 | Yang | H01L 33/62 |
| 2022/0350199 A1* | 11/2022 | Sang | G03F 7/00 |
| 2022/0352237 A1* | 11/2022 | Song | H01L 33/60 |
| 2022/0352437 A1* | 11/2022 | Song | H01L 33/507 |
| 2022/0404659 A1* | 12/2022 | Qi | G02F 1/1336 |

FOREIGN PATENT DOCUMENTS

| | | |
|---|---|---|
| CN | 101673016 A | 3/2010 |
| CN | 104035253 A | 9/2014 |
| CN | 104503171 A | 4/2015 |
| CN | 108807356 A | 11/2018 |
| CN | 110827702 A | 2/2020 |
| CN | 110910774 A | 3/2020 |
| CN | 110911392 A | 3/2020 |
| CN | 111081720 A | 4/2020 |
| CN | 111261057 A | 6/2020 |
| CN | 111462638 A | 7/2020 |
| CN | 112201165 A | 1/2021 |
| CN | 112259592 A | 1/2021 |
| CN | 112838116 A | 5/2021 |
| TW | 201944584 A | 11/2019 |

OTHER PUBLICATIONS

Written Opinion of the International Search Authority in International application No. PCT/CN2021/109191, mailed on Mar. 28, 2022.

Chinese Office Action issued in corresponding Chinese Patent Application No. 202110829314.2 dated Oct. 20, 2022, pp. 1-9.

Chinese Office Action issued in corresponding Chinese Patent Application No. 202110829314.2 dated May 19, 2023, pp. 1-10.

* cited by examiner

LIGHT-EMITTING DIODE PANEL AND SPLICED PANEL

FIELD OF INVENTION

The present disclosure relates to the field of display technologies, and more particularly, to a light-emitting diode panel and a spliced panel.

BACKGROUND OF INVENTION

During research and practice of current technology, the inventor of the present application finds that in sub-millimeter light-emitting diode spliced panels and micro light-emitting diode spliced panels, flexible circuit boards generally need to be bent to a back side of light-emitting diode panels, thereby forming a bending radius, so light-emitting diodes adjacent to seams between the light-emitting diode panels have a larger distance between each other, thereby affecting optical uniformity.

Technical problem: an embodiment of the present disclosure provides a light-emitting diode panel and a spliced panel to reduce distances between the light-emitting diodes adjacent to the seams when splicing.

SUMMARY OF INVENTION

An embodiment of the present disclosure provides a light-emitting diode panel, which includes:
- a substrate including a first area and a second area positioned on a peripheral side of the first area, wherein, the substrate is provided with a plurality of through-holes defined in the first area or the second area;
- a plurality of conductors, wherein, one of the conductors is disposed in one of the through-holes;
- a plurality of light-emitting units disposed on the substrate and corresponding to the first area, wherein, one of the light-emitting units includes at least one light-emitting diode;
- a plurality of first wirings disposed on the substrate and connecting the at least one light-emitting diode to the conductors;
- at least one flexible circuit board disposed on a surface of the substrate away from the light-emitting units; and
- a plurality of second wirings disposed on the surface of the substrate away from the light-emitting units and connecting the conductors to the at least one flexible circuit board.

Optionally, in some embodiments of the present disclosure, the through-holes are defined in the first area.

Optionally, in some embodiments of the present disclosure, the light-emitting units and the through-holes are arranged along a first direction, respectively, the through-holes and at least a part of the light-emitting units are arranged alternatingly along a second direction, and the first direction and the second direction are arranged crosswise; and
  the light-emitting units are connected to one of the conductors by at least one of the first wirings.

Optionally, in some embodiments of the present disclosure, the first area includes a first sub-area, a second sub-area positioned on one side of the first sub-area, and a third sub-area positioned on another side of the first sub-area; the through-holes include a plurality of first through-holes and a plurality of second through-holes, the first through-holes are defined at a junction of the first sub-area and the second sub-area, and the second through-holes are defined at a junction of the first sub-area and the third sub-area; the conductors include first conductors disposed in the first through-holes and second conductors disposed in the second through-holes;
  the light-emitting units disposed in the second sub-area are electrically connected to the first conductors, the light-emitting units disposed in the third sub-area are electrically connected to the second conductors, and the light-emitting units disposed in the first sub-area are electrically connected to the first conductors and/or the second conductors.

Optionally, in some embodiments of the present disclosure, the first area includes a first sub-area and a second sub-area positioned on one side of the first sub-area; the through-holes include a plurality of first through-holes and a plurality of second through-holes, and the first through-holes and the second through-holes are arranged along a first direction; the conductors include first conductors disposed in the first through-holes and second conductors disposed in the second through-holes;
  the first through-holes and the second through-holes are defined at a junction of the first sub-area and the second sub-area; and
  the light-emitting units disposed in the first sub-area are electrically connected to the first conductors by at least one of the first wirings, and the light-emitting units disposed in the second sub-area are electrically connected to the second conductors by at least another one of the first wirings.

Optionally, in some embodiments of the present disclosure, the first through-holes and the second through-holes are arranged alternatingly along the first direction.

Optionally, in some embodiments of the present disclosure, the through-holes are defined in the second area and on one side of the first area, the through-holes are arranged along a first direction, the light-emitting units are arranged along the first direction and a second direction, and the first direction and the second direction are arranged crosswise; and
  each row of the light-emitting units is connected to one of the conductors by the first wirings.

Optionally, in some embodiments of the present disclosure, the through-holes are defined in the second area and include a plurality of first through-holes and a plurality of second through-holes, the first through-holes are defined on one side of the first area, and the second through-holes are defined on another side of the first area; the conductors include first conductors disposed in the first through-holes and second conductors disposed in the second through-holes;
  the first through-holes and the second through-holes are arranged along a first direction, respectively, the light-emitting units are arranged along the first direction and a second direction, and the first direction and the second direction are arranged crosswise; and
  in each row of the light-emitting units, a part of the light-emitting units is connected to one of the first conductors by the first wirings, and another part of the light-emitting units is connected to one of the second conductors by the first wirings.

Optionally, in some embodiments of the present disclosure, the through-holes are defined in the second area and include a plurality of first through-holes and a plurality of second through-holes, the first through-holes are defined on one side of the first area, and the second through-holes are defined on another side of the first area; the conductors include first conductors disposed in the first through-holes and second conductors disposed in the second through-holes;
  the first through-holes are arranged along a first direction, the second through-holes are arranged along a second direction, the light-emitting units are arranged along the first direction and the second direction, and the first direction and the second direction are arranged crosswise; and
  a part of the light-emitting units is connected to one of the first conductors by the first wirings, and another part of the light-emitting units is connected to one of the second conductors by the first wirings.

Optionally, in some embodiments of the present disclosure, the at least one light-emitting diode is a sub-millimeter light-emitting diode or a micro light-emitting diode.

An embodiment of the present disclosure further provides a spliced panel, which is spliced by at least two light-emitting diode panels that are the light-emitting diode panel mentioned in any one of the above embodiments.

Optionally, each light-emitting diode panel includes:
  a substrate including a first area and a second area positioned on a peripheral side of the first area, wherein, the substrate is provided with a plurality of through-holes defined in the first area or the second area;
  a plurality of conductors, wherein, one of the conductors is disposed in one of the through-holes;
  a plurality of light-emitting units disposed on the substrate and corresponding to the first area, wherein, one of the light-emitting units includes at least one light-emitting diode;
  a plurality of first wirings disposed on the substrate and connecting the at least one light-emitting diode to the conductors;
  at least one flexible circuit board disposed on a surface of the substrate away from the light-emitting units; and
  a plurality of second wirings disposed on the surface of the substrate away from the light-emitting units and connecting the conductors to the at least one flexible circuit board.

Optionally, in some embodiments of the present disclosure, the through-holes are defined in the first area.

Optionally, in some embodiments of the present disclosure, the light-emitting units and the through-holes are arranged along a first direction, respectively, the through-holes and at least a part of the light-emitting units are arranged alternatingly along a second direction, and the first direction and the second direction are arranged crosswise; and
  the light-emitting units are connected to one of the conductors by at least one of the first wirings.

Optionally, in some embodiments of the present disclosure, the first area includes a first sub-area, a second sub-area positioned on one side of the first sub-area, and a third sub-area positioned on another side of the first sub-area; the through-holes include a plurality of first through-holes and a plurality of second through-holes, the first through-holes are defined at a junction of the first sub-area and the second sub-area, and the second through-holes are defined at a junction of the first sub-area and the third sub-area; the conductors include first conductors disposed in the first through-holes and second conductors disposed in the second through-holes;
  the light-emitting units disposed in the second sub-area are electrically connected to the first conductors, the light-emitting units disposed in the third sub-area are electrically connected to the second conductors, and the light-emitting units disposed in the first sub-area are electrically connected to the first conductors and/or the second conductors.

Optionally, in some embodiments of the present disclosure, the first area includes a first sub-area and a second sub-area positioned on one side of the first sub-area; the through-holes include a plurality of first through-holes and a plurality of second through-holes, and the first through-holes and the second through-holes are arranged along a first direction; the conductors include first conductors disposed in the first through-holes and second conductors disposed in the second through-holes;
  the first through-holes and the second through-holes are defined at a junction of the first sub-area and the second sub-area; and
  the light-emitting units disposed in the first sub-area are electrically connected to the first conductors by at least one of the first wirings, and the light-emitting units disposed in the second sub-area are electrically connected to the second conductors by at least another one of the first wirings.

Optionally, in some embodiments of the present disclosure, the first through-holes and the second through-holes are arranged alternatingly along the first direction.

Optionally, in some embodiments of the present disclosure, the through-holes are defined in the second area and on one side of the first area, the through-holes are arranged along a first direction, the light-emitting units are arranged along the first direction and a second direction, and the first direction and the second direction are arranged crosswise; and
  each row of the light-emitting units is connected to one of the conductors by the first wirings.

Optionally, in some embodiments of the present disclosure, the through-holes are defined in the second area and include a plurality of first through-holes and a plurality of second through-holes, the first through-holes are defined on one side of the first area, and the second through-holes are defined on another side of the first area; the conductors include first conductors disposed in the first through-holes and second conductors disposed in the second through-holes;
  the first through-holes and the second through-holes are arranged along a first direction, respectively, the light-emitting units are arranged along the first direction and a second direction, and the first direction and the second direction are arranged crosswise; and
  in each row of the light-emitting units, a part of the light-emitting units is connected to one of the first conductors by the first wirings, and another part of the light-emitting units is connected to one of the second conductors by the first wirings.

Optionally, in some embodiments of the present disclosure, the through-holes are defined in the second area and include a plurality of first through-holes and a plurality of second through-holes, the first through-holes are defined on one side of the first area, and the second through-holes are defined on another side of the first area; the conductors include first conductors disposed in the first through-holes and second conductors disposed in the second through-holes;
  the first through-holes are arranged along a first direction, the second through-holes are arranged along a second direction, the light-emitting units are arranged along the first direction and the second direction, and the first direction and the second direction are arranged crosswise; and a part of the light-emitting units is connected to one of the first conductors by the first wirings, and another part of the light-emitting units is connected to one of the second conductors by the first wirings.

Optionally, in some embodiments of the present disclosure, the at least one light-emitting diode is a sub-millimeter light-emitting diode or a micro light-emitting diode.

Beneficial effect: in the embodiments of the present disclosure, the substrate is provided with the through-holes, and the conductors are disposed in the through-holes, wherein, the light-emitting units are connected to one end of the conductors by the first wirings, and the at least one flexible circuit board is connected to another end of the conductors by the second wirings. Therefore, the at least one flexible circuit board can be directly disposed on a back side of the substrate, which can reduce a bezel width of the light-emitting diode panel, thereby reducing a distance between light-emitting diodes on both sides of seams when the at least two light-emitting diode panels are spliced.

DESCRIPTION OF DRAWINGS

The accompanying figures to be used in the description of embodiments of the present disclosure will be described in brief to more clearly illustrate the technical solutions of the embodiments. The accompanying figures described below are only part of the embodiments of the present disclosure, from which those skilled in the art can derive further figures without making any inventive efforts.

DETAILED DESCRIPTION OF PREFERRED EMBODIMENTS

Figure 1:
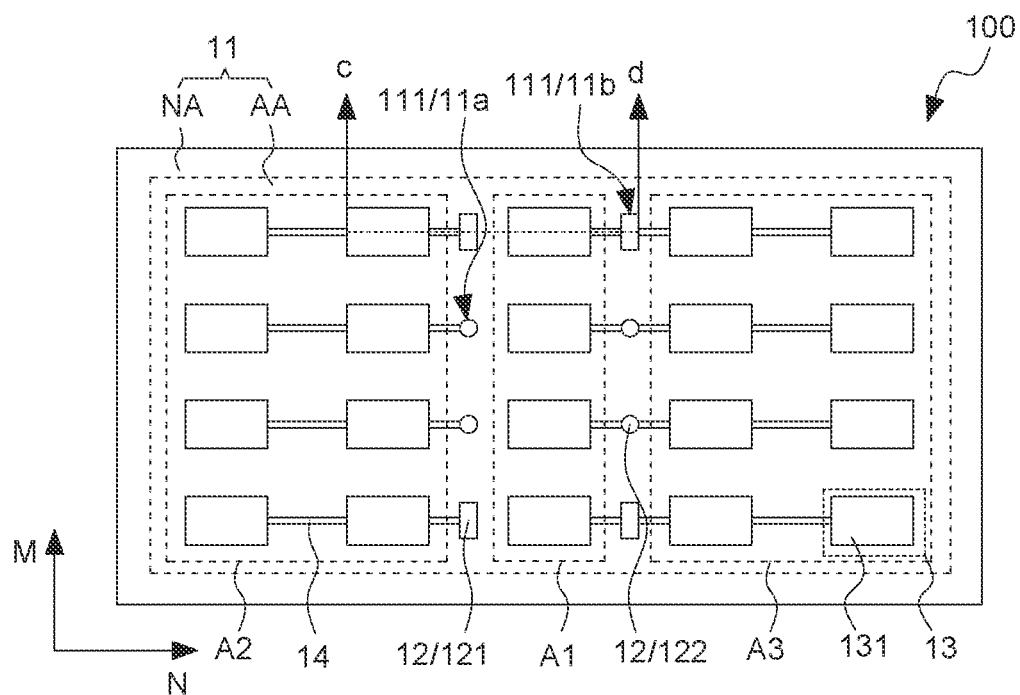
FIG. 1 is a schematic structural top view of a first structure of a light-emitting diode panel according to an embodiment of the present disclosure.

The technical solutions in the embodiments of the present disclosure will be clearly and completely described below with reference to the drawings in the embodiments of the present disclosure. Obviously, the described embodiments are only a part of the embodiments of the present disclosure, but not all the embodiments. Based on the embodiments in the present disclosure, all other embodiments obtained by those skilled in the art without creative efforts are within the scope of the present disclosure. In addition, it should be understood that the specific embodiments described herein are only used to illustrate and explain the disclosure, and are not used to limit the disclosure. In the present disclosure, in the case of no explanation to the contrary, the orientation words used such as "on" and "under" usually refer to upper and lower directions of the device in actual use or working state, and specifically the directions in the drawings; and "inside" and "outside" refer to the outline of the device.

The embodiments of the present disclosure provide a light-emitting diode panel and a spliced panel, which will be described in detail below. It should be noted that an order of description in the following embodiments is not meant to limit a preferred order of the embodiments.

Figure 2:
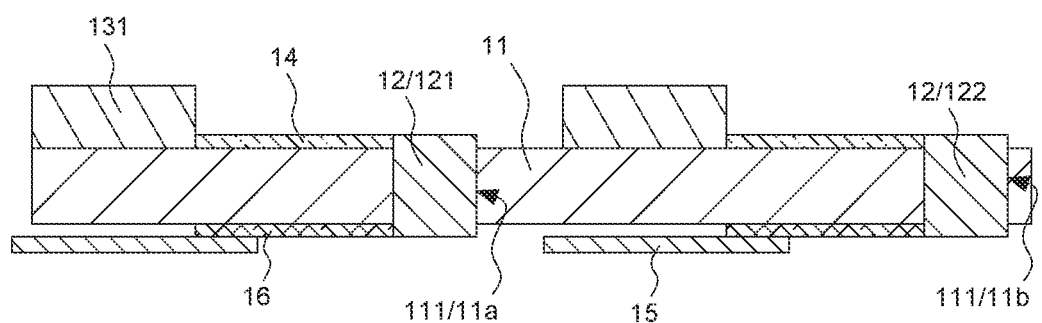
FIG. 2 is a schematic cross-sectional structural diagram of the light-emitting diode panel along line cd in FIG. 1.
Figure 3:
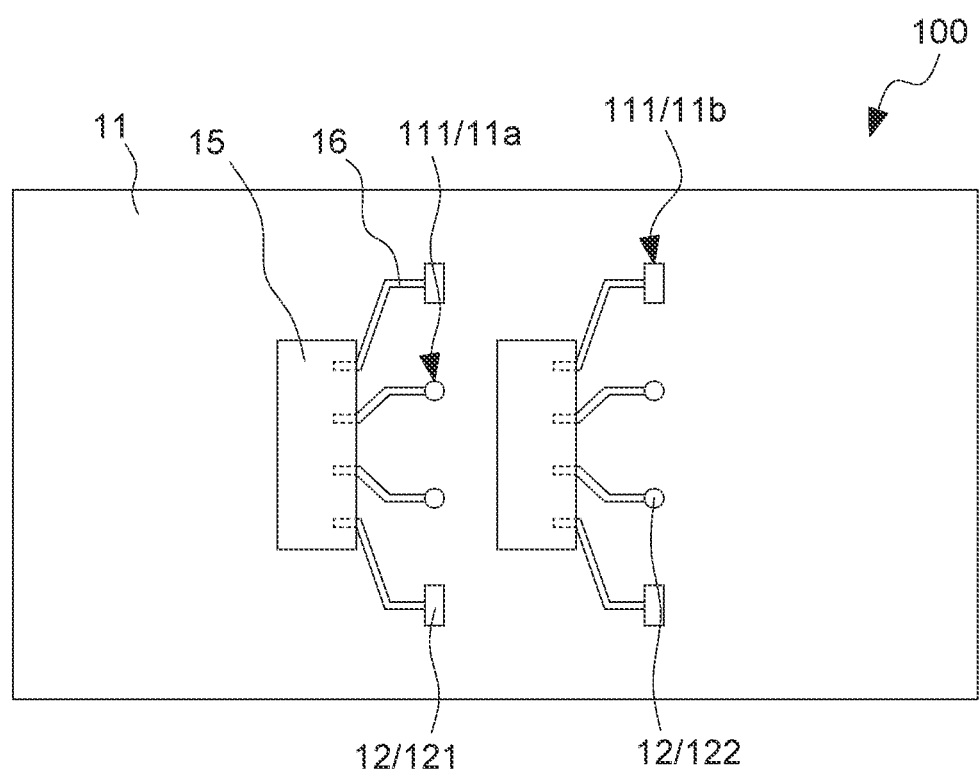
FIG. 3 is a schematic structural bottom view of the first structure of the light-emitting diode panel according to an embodiment of the present disclosure.

Referring to FIGS. 1 to 3, this embodiment provides a light-emitting diode panel 100, which includes a substrate 11, a plurality of conductors 12, a plurality of light-emitting units 13, a plurality of first wirings 14, at least one flexible circuit board 15, and a plurality of second wirings 16.

The substrate 11 includes a first area AA and a second area NA positioned on a peripheral side of the first area AA. The substrate 11 is provided with a plurality of through-holes 111 defined in the first area AA or the second area NA.

One of the conductors 12 is correspondingly disposed in one of the through-holes 111. The conductors 12 are correspondingly disposed in the through-holes 111 by one to one.

The light-emitting units 13 are disposed on the substrate 11 and correspond to the first area AA. Each of the light-emitting units 13 includes at least one light-emitting diode 131. The first wirings 14 are disposed on the substrate 11 and connect the at least one light-emitting diode 131 to the conductors 12. That is, the light-emitting units 13 and the first wirings 14 are disposed on a same surface of the substrate 11.

Wherein, one of the light-emitting units 13 is electrically connected to one of the conductors 12, or a plurality of the light-emitting units 13 are electrically connected to one of the conductors 12.

It should be noted that "connect" can not only mean a physical connection, but also an electrical connection.

The at least one flexible circuit board 15 is disposed on a surface of the substrate 11 away from the light-emitting units 13. The second wirings 16 are disposed on the surface of the substrate 11 away from the light-emitting units 13 and connect the conductors 12 to the at least one flexible circuit board 15. That is, the at least one flexible circuit board 15 and the second wirings 16 are both disposed on another surface of the substrate 11.

In the light-emitting diode panel 100 of this embodiment, the substrate 11 is provided with the through-holes 111, and the conductors 12 are disposed in the through-holes 111. Wherein, the light-emitting units 13 are connected to one end of the conductors 12 by the first wirings 14, and the at least one flexible circuit board 15 is connected to another end of the conductors 12 by the second wirings 16. Therefore, the at least one flexible circuit board 15 can be directly disposed on a back side of the substrate 11, which can reduce a bezel width of the light-emitting diode panel 100, thereby reducing a distance between light-emitting diodes 131 on both sides of seams when light-emitting diode panels 100 are spliced.

Optionally, the substrate 11 may be a rigid substrate, such as a glass substrate, a sapphire substrate, or a silicon substrate. In some embodiments, the substrate 11 may also be a flexible substrate.

Optionally, a material of the conductors 12 may be conductive substances, such as solder, metal, nano gold wires, metal oxides, conductive glues, or conductive particles.

Optionally, the at least one light-emitting diode 131 may be a sub-millimeter light-emitting diode (mini-LED) or a micro light-emitting diode (micro-LED).

Optionally, the at least one flexible circuit board 15 may be a flexible circuit board or a chip on film.

Optionally, materials of the first wirings 14 and the second wirings 16 may be indium tin oxide or indium zinc oxide, or may be metal, alloys, compounds, or mixtures thereof having various conductive properties, respectively, for example, may be gold, silver, tungsten, molybdenum, iron, aluminum, aluminum-silicon, aluminum-titanium, or metal nitride.

Optionally, the through-holes 111 are defined in the first area AA. A width of the second area NA can be reduced by defining the through-holes 111 in the first area AA and not defining the through-holes 111 in the second area NA. In addition, the through-holes 111 may be disposed between the light-emitting units 13, that is, a space between the light-emitting units 13 is used to define the through-holes 111, thereby achieving an effect of saving space.

Optionally, one light-emitting unit 13 may include one light-emitting diode 131, two, three, or more than three light-emitting diodes 131.

Optionally, the light-emitting units 13 and the through-holes 111 are arranged in columns along a first direction M, respectively. The through-holes 111 and at least a part of the light-emitting units 13 are arranged alternatingly along a second direction N.

Wherein, the first direction M and the second direction N are arranged crosswise. Optionally, the first direction M is perpendicular to the second direction N.

The light-emitting units 13 are connected to one of the conductors 12 by at least one of the first wirings 14.

Optionally, the first area AA includes a first sub-area A1, a second sub-area A2 positioned on one side of the first sub-area A1, and a third sub-area A3 positioned on another side of the first sub-area A1. The through-holes 111 include a plurality of first through-holes 11a and a plurality of second through-holes 11b, the first through-holes 11a are defined at a junction of the first sub-area A1 and the second sub-area A2, and the second through-holes 11b are defined at a junction of the first sub-area A1 and the third sub-area A3.

The conductors 12 include first conductors 121 disposed in the first through-holes 11a and second conductors 122 disposed in the second through-holes 11b.

The light-emitting units 13 disposed in the second sub-area A2 are electrically connected to the first conductors 121, the light-emitting units 13 disposed in the third sub-area A3 are electrically connected to the second conductors 122, and the light-emitting units 13 disposed in the first sub-area A1 are electrically connected to the first conductors 121 or the second conductors 122.

In some embodiments, among the light-emitting units 13 disposed in the first sub-area A1, a part of the light-emitting units 13 is electrically connected to the first conductors 121, and another part of the light-emitting units 13 is electrically connected to the second conductors 122.

Optionally, in the second direction N, the first through-holes 11a and the second through-holes 11b may be staggered from each other to reduce a risk of damaging the substrate 11.

In addition, referring to FIG. 3, optionally, each of the second wirings 16 is connected to one of the conductors 12. Wherein, from an edge area at both ends to a middle area, a length of the second wirings 16 is gradually reduced. Shapes of the conductors 12 connected to the second wirings 16 in the middle area are rectangular, and shapes of the conductors 12 connected to the second wirings 16 in the edge area are circular. This disposition can reduce a difference of resistances between the second wirings 16.

When the shapes of the conductors 12 are rectangular, the through-holes 111 corresponding thereto are also rectangular, and when the shapes of the conductors 12 are circular, the through-holes 111 corresponding thereto are also circular.

In some embodiments, shapes of the through-holes 111 may all be circular or rectangular, and may also be other shapes.

Optionally, each of the second wirings 16 includes a connecting segment, a middle segment, and a bonding segment connected to each other in sequence, the connecting segment is connected to the conductors 12, and the bonding segment is connected and bonded to the at least one flexible circuit board 15.

Extending directions of adjacent connecting segments are parallel to each other, and a width of connecting segments connected to rectangular conductors 12 are wider than a width of connecting segments connected to circular conductors 12. Extending directions of adjacent bonding segments are also parallel to each other, and widths of the adjacent bonding segments are same.

Among the second wirings 16 connected to the circular conductors 12, widths of the connecting segment, the middle segment, and the bonding segment are same, and among the second wirings 16 connected to the rectangular conductors 12, the width of the connecting segment is wider than the width of the bonding segment, and in a direction from the connecting segment to the bonding segment, the width of the middle segment is gradually reduced. The disposition mentioned above can reduce an impedance difference between the second wirings 16.

Figure 4:
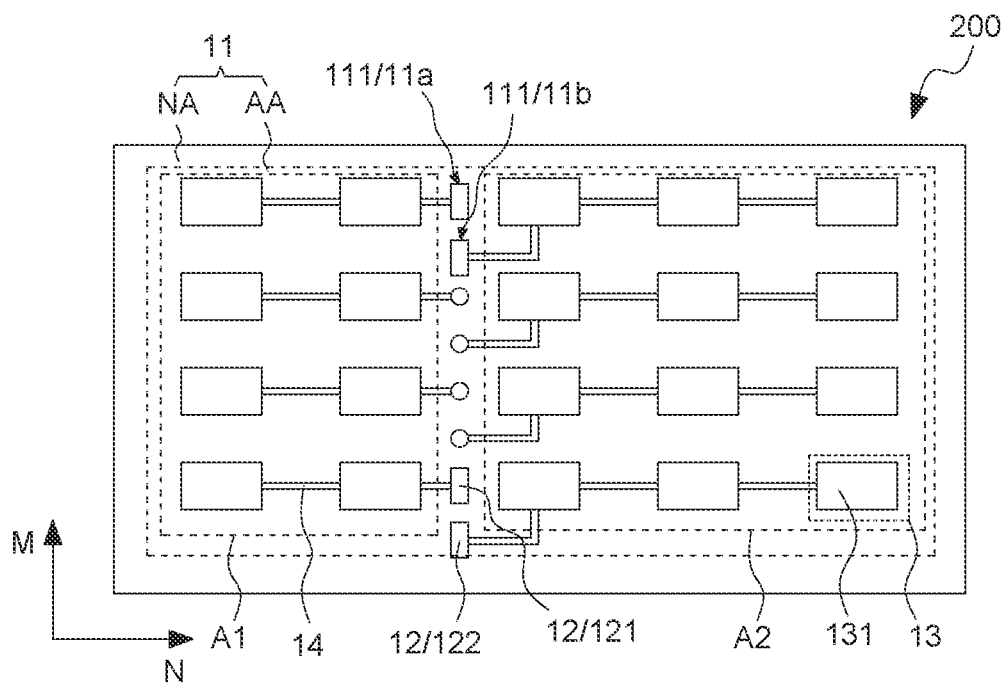
FIG. 4 is a schematic structural top view of a second structure of the light-emitting diode panel according to an embodiment of the present disclosure.
Figure 5:
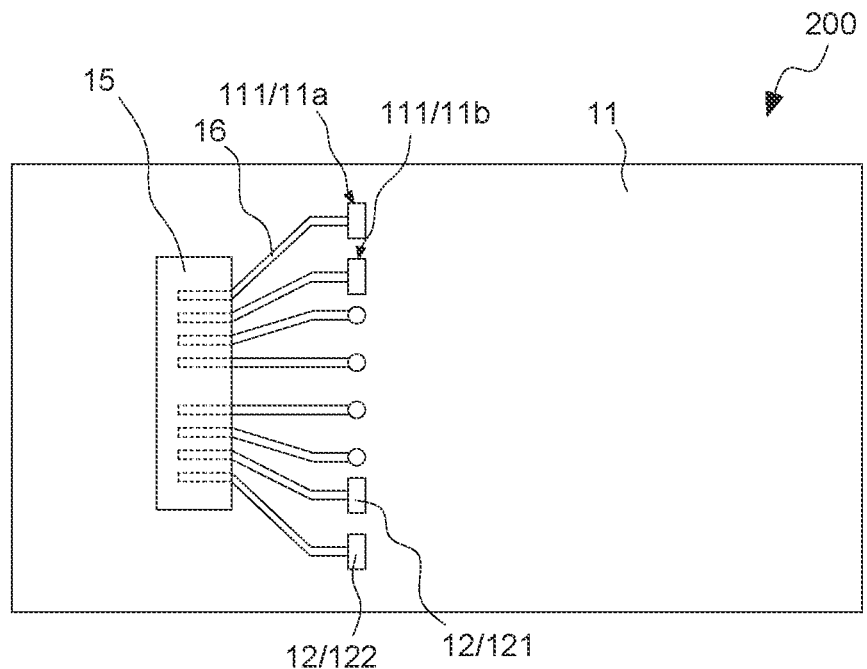
FIG. 5 is a schematic structural bottom view of the second structure of the light-emitting diode panel according to an embodiment of the present disclosure.

Referring to FIGS. 4 and 5, a difference between a light-emitting diode panel 200 in this embodiment and the light-emitting diode panel 100 in the above embodiment is that the first area AA of the light-emitting diode panel 200 includes the first sub-area A1 and the second sub-area A2 positioned on one side of the first sub-area A1. The through-holes 111 include the plurality of first through-holes 11a and the plurality of second through-holes 11b, and the first through-holes 11a and the second through-holes 11b are arranged along the first direction M. The conductors 12 include the first conductors 121 disposed in the first through-holes 11a and the second conductors 122 disposed in the second through-holes 11b.

The first through-holes 11a and the second through-holes 11b are defined at a junction of the first sub-area A1 and the second sub-area A2.

The light-emitting units 13 disposed in the first sub-area A1 are electrically connected to the first conductors 121 by at least one of the first wirings 14, and the light-emitting units 13 disposed in the second sub-area A2 are electrically connected to the second conductors 122 by at least another one of the first wirings 14.

Optionally, the first through-holes 11a and the second through-holes 11b are arranged alternatingly along the first direction M. Arranging the first through-holes 11a and the second through-holes 11b alternatingly along the first direction M can omit one flexible circuit board 15.

Optionally, the light-emitting units 13 are arranged in a matrix.

Figure 6:
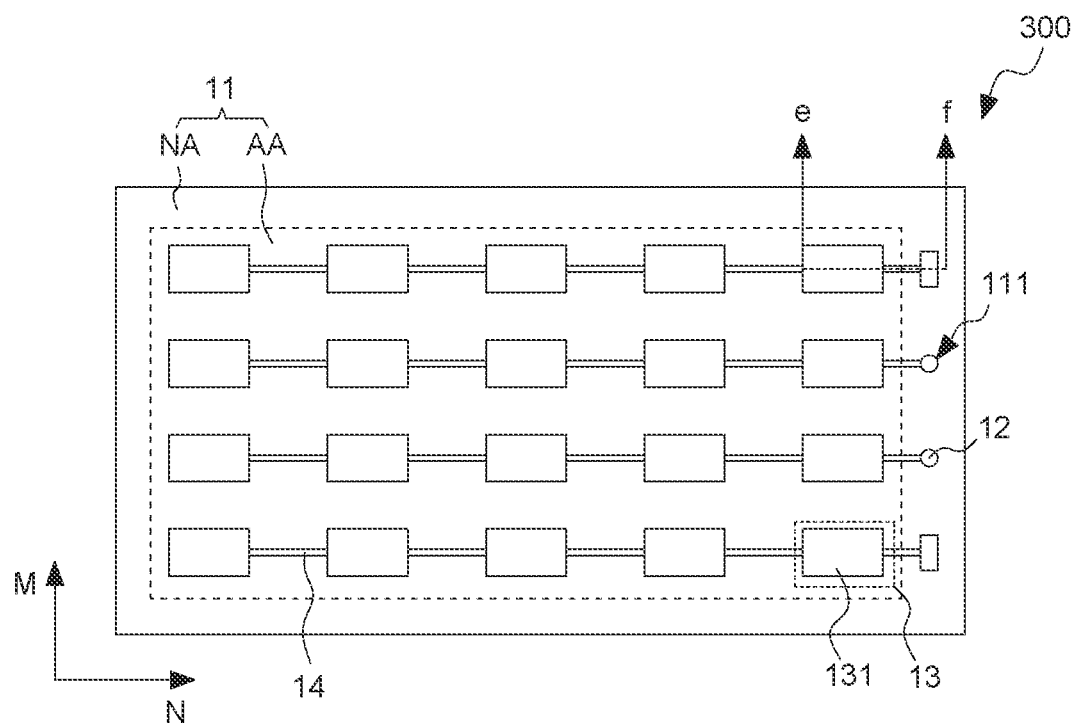
FIG. 6 is a schematic structural top view of a third structure of the light-emitting diode panel according to an embodiment of the present disclosure.
Figure 7:
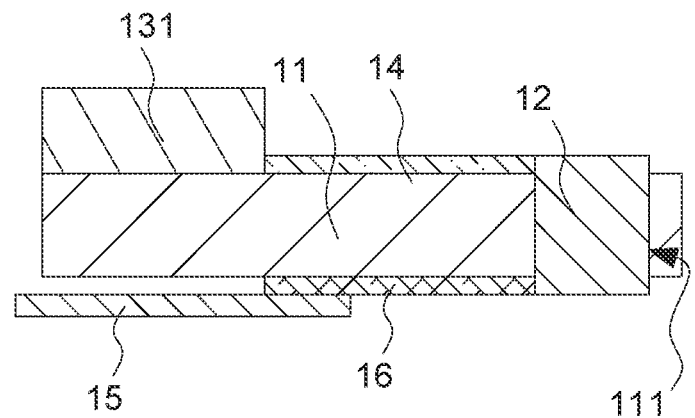
FIG. 7 is a schematic cross-sectional structural diagram of the light-emitting diode panel along line ef in FIG. 6.
Figure 8:
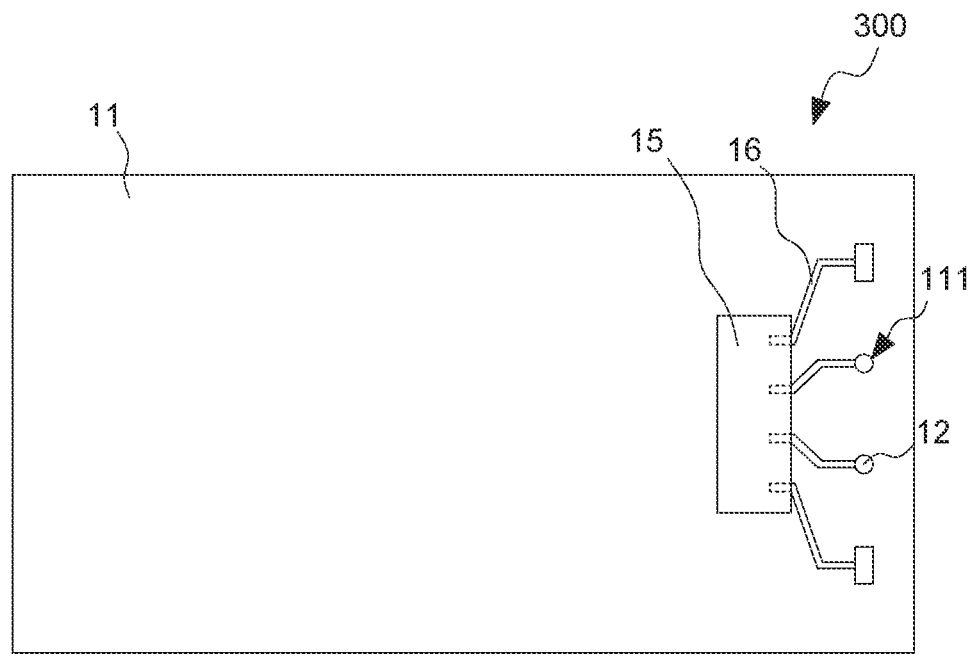
FIG. 8 is a schematic structural bottom view of the third structure of the light-emitting diode panel according to an embodiment of the present disclosure.

Referring to FIGS. 6 to 8, a difference between a light-emitting diode panel 300 in this embodiment and the light-emitting diode panel 100 in the above embodiment is that the through-holes 111 of the light-emitting diode panel 300 are defined in the second area NA.

Optionally, the through-holes 111 are defined on one side of the first area AA and are arranged in columns along the first direction M. The light-emitting units 13 are arranged in columns along the first direction M and in rows along the second direction N, and the first direction M and the second direction N are arranged crosswise.

Optionally, the first direction M is perpendicular to the second direction N.

Each row of the light-emitting units 13 is connected to one of the conductors 12 by the first wirings 14. The conductors 12 are disposed in the through-holes 111.

Optionally, the light-emitting diode panel 300 includes a short side and a long side, and the through-holes 111 are positioned on the short side, thereby reducing a number of the through-holes 111.

Figure 9:
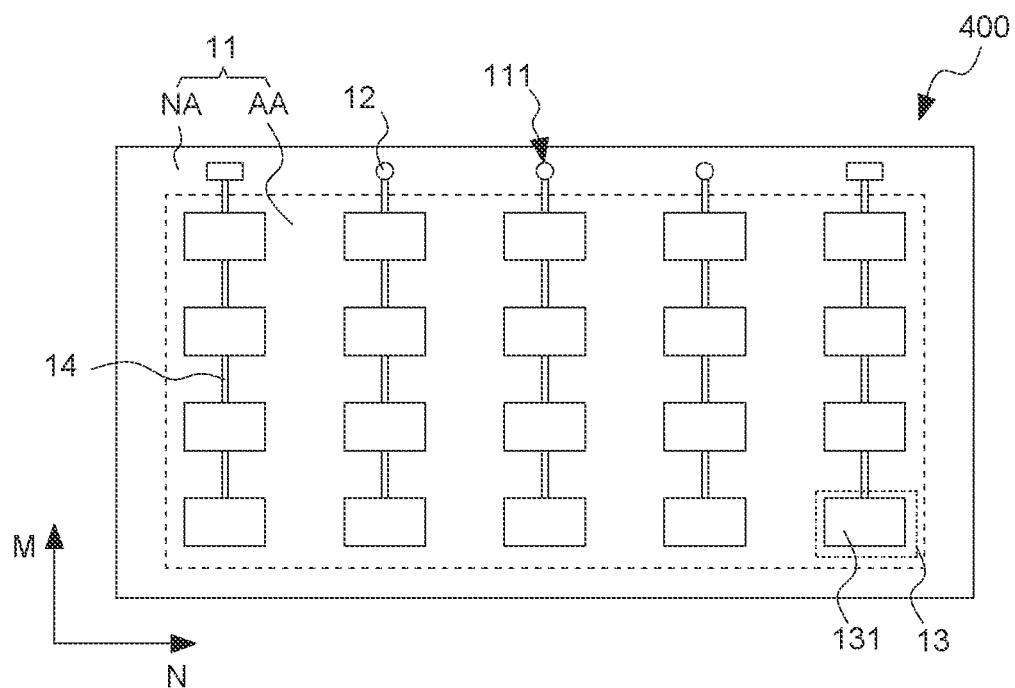
FIG. 9 is a schematic structural top view of a fourth structure of the light-emitting diode panel according to an embodiment of the present disclosure.

Referring to FIG. 9, a difference between a light-emitting diode panel 400 in this embodiment and the light-emitting diode panel 300 in the above embodiment is that the through-holes 111 are arranged in rows along the second direction N. The light-emitting units 13 are arranged in columns along the first direction M and in rows along the second direction N, and the first direction M and the second direction N are arranged crosswise.

Optionally, the first direction M is perpendicular to the second direction N.

Each column of the light-emitting units 13 is connected to one of the conductors 12 by the first wirings 14. The conductors 12 are disposed in the through-holes 111.

Optionally, the light-emitting diode panel 400 includes the short side and the long side, and the through-holes 111 are positioned on the long side, thereby reducing impedances of the first wirings 14.

Figure 10:
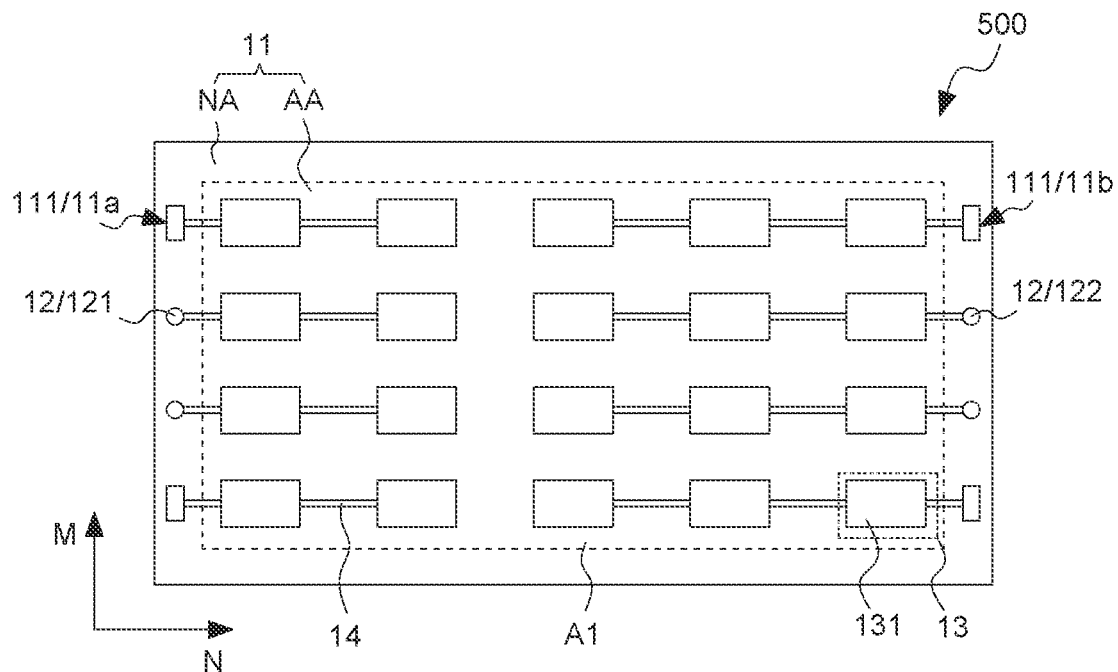
FIG. 10 is a schematic structural top view of a fifth structure of the light-emitting diode panel according to an embodiment of the present disclosure.

Referring to FIG. 10, a difference between a light-emitting diode panel 500 in this embodiment and the light-emitting diode panel 300 in the above embodiment is that: the through-holes 111 include the first through-holes 11a and the second through-holes 11b, the first through-holes 11a are defined on one side of the first area AA, and the second through-holes 11b are defined on another side of the first area AA; and the conductors 12 include the first conductors 121 disposed in the first through-holes 11a and the second conductors 122 disposed in the second through-holes 11b.

The first through-holes 11a and the second through-holes 11b are arranged in columns along the first direction M, respectively. The light-emitting units 13 are arranged in columns along the first direction M and in rows along the second direction N, and the first direction M and the second direction N are arranged crosswise. Optionally, the first direction M is perpendicular to the second direction N.

In each row of the light-emitting units 13, a part of the light-emitting units 13 is connected to one of the first conductors 121 by one of the first wirings 14, and another part of the light-emitting units 13 is connected to one of the second conductors 122 by another one of the first wirings 14.

Figure 11:
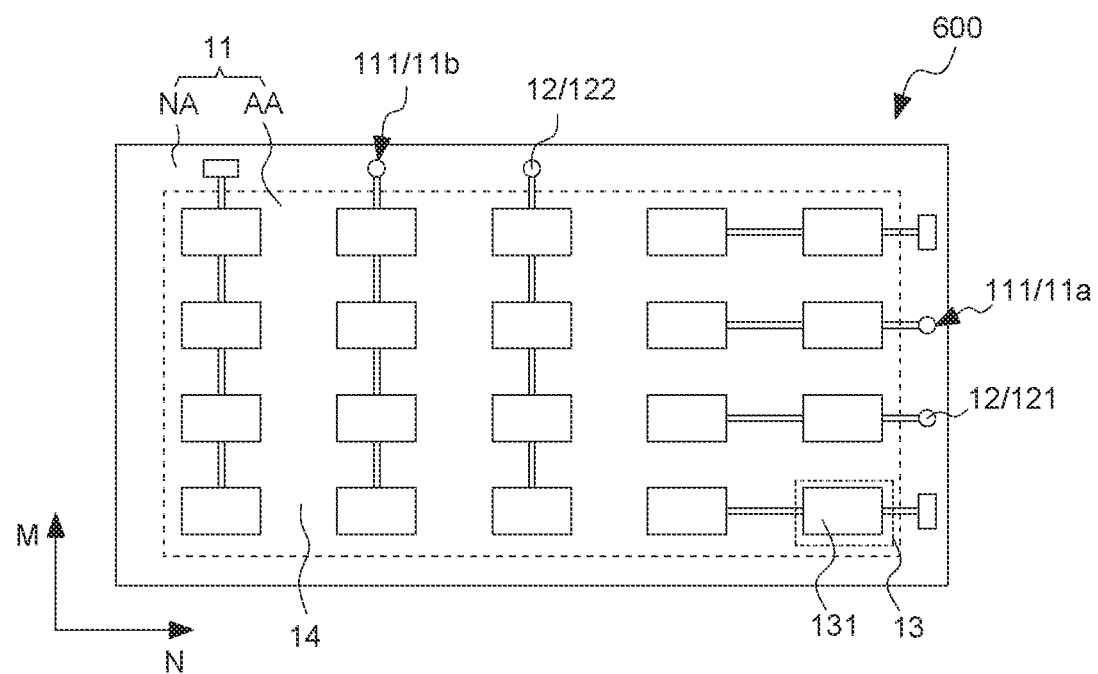
FIG. 11 is a schematic structural top view of a sixth structure of the light-emitting diode panel according to an embodiment of the present disclosure.

Referring to FIG. 11, a difference between a light-emitting diode panel 600 in this embodiment and the light-emitting diode panel 300 in the above embodiment is that: the through-holes 111 include the first through-holes 11a and the second through-holes 11b, the first through-holes 11a are defined on one side of the first area AA, and the second through-holes 11b are defined on yet another side of the first area AA; and the conductors 12 include the first conductors 121 disposed in the first through-holes 11a and the second conductors 122 disposed in the second through-holes 11b.

The first through-holes 11a are arranged in columns along the first direction M, the second through-holes 11b are arranged in rows along the second direction N, the light-emitting units 13 are arranged in columns along the first direction M and in rows along the second direction N, and the first direction M and the second direction N are arranged crosswise.

A part of the light-emitting units 13 is connected to one of the first conductors 121 by one of the first wirings 14, and another part of the light-emitting units 13 is connected to one of the second conductors 122 by another one of the first wirings 14.

This disposition can reduce an impedance difference between the first wirings 14.

In some embodiments, the through-holes 111 may also be defined surrounding the first area AA, that is, the through-holes 111 are positioned on four sides around the first area AA, and the conductors 12 disposed in the through-holes 111 in each side are connected to a part of the light-emitting units 13. This disposition can further reduce the impedance difference between the first wirings 14.

Figure 12:
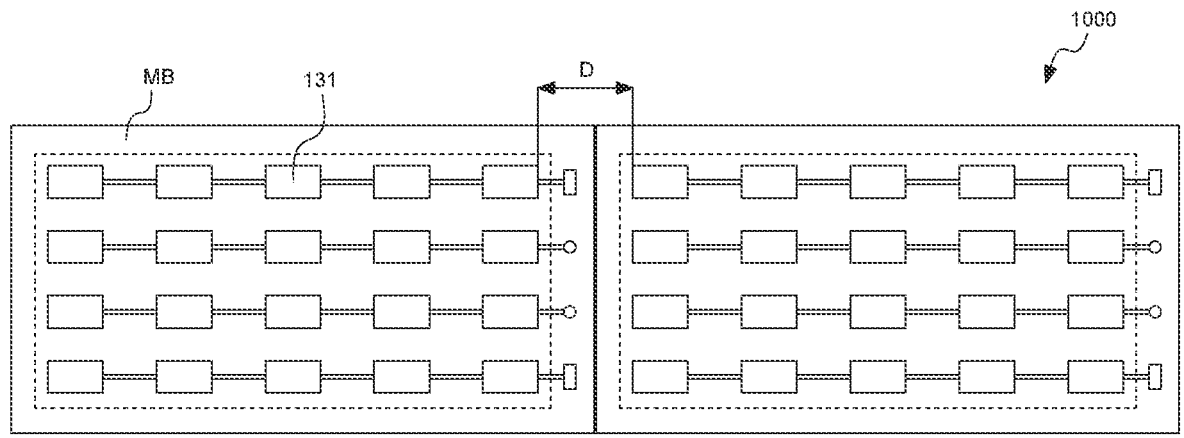
FIG. 12 is a schematic structural diagram of a spliced panel according to an embodiment of the present disclosure.

Referring to FIG. 12, an embodiment of the present disclosure further provides a spliced panel 1000, which is spliced by at least two light-emitting diode panels that are the light-emitting diode panel mentioned in any one of the above embodiments.

When light-emitting diode panels MB are the light-emitting diode panels 100 or the light-emitting diode panels 200, a distance D between the light-emitting diodes 131 adjacent to a seam between two light-emitting diode panels MB may be as small as possible.

When the light-emitting diode panels MB are the light-emitting diode panels 300 or the light-emitting diode panels 400, the two light-emitting diode panels MB may be spliced by having one side having the through-holes 111 to be adjacent to another side not having the through-holes 111, thereby reducing the distance D between the light-emitting diodes 131 adjacent to the seam.

When the light-emitting diode panels MB are the light-emitting diode panels 600, the two light-emitting diode panels MB may be spliced by having one side having the through-holes 111 to be adjacent to another side not having the through-holes 111, thereby reducing the distance D between the light-emitting diodes 131 adjacent to the seam.

It should be noted that the light-emitting diode panels 300 in the above embodiment being the light-emitting diode panels MB is taken as an example in this embodiment, but the present disclosure is not limited to this.

In the embodiments of the present disclosure, the substrate is provided with the through-holes, and the conductors are disposed in the through-holes, wherein, the light-emitting units are connected to one end of the conductors by the first wirings, and the at least one flexible circuit board is connected to another end of the conductors by the second wirings. Therefore, the at least one flexible circuit board can be directly disposed on the back side of the substrate, which can reduce the bezel width of the light-emitting diode panel, thereby reducing the distance between the light-emitting diodes on both sides of seams when the at least two light-emitting diode panels are spliced.

The light-emitting diode panel and the spliced panel provided in the embodiments of the present disclosure are described in detail above. Specific examples are used herein to explain the principles and implementation of the present disclosure. The descriptions of the above embodiments are only used to help understand the method of the present disclosure and its core ideas; meanwhile, for those skilled in the art, the range of specific implementation and application may be changed according to the ideas of the present disclosure. In summary, the content of the specification should not be construed as causing limitations to the present disclosure.

What is claimed is:

1. A light-emitting diode panel comprising:
    a substrate comprising a first area and a second area positioned on a peripheral side of the first area, wherein the substrate is provided with a plurality of through-holes defined in the first area;
    a plurality of conductors, wherein one of the conductors is disposed in one of the through-holes;
    a plurality of light-emitting units disposed on the substrate and corresponding to the first area, wherein one of the light-emitting units comprises at least one light-emitting diode;
    a plurality of first wirings disposed on the substrate and connecting the at least one light-emitting diode to the conductors;
    at least one flexible circuit board disposed on a surface of the substrate away from the light-emitting units; and
    a plurality of second wirings disposed on the surface of the substrate away from the light-emitting units and connecting the conductors to the at least one flexible circuit board.

2. The light-emitting diode panel according to claim 1, wherein the light-emitting units and the through-holes are arranged along a first direction, respectively, the through-holes and at least a part of the light-emitting units are arranged alternatingly along a second direction, and the first direction and the second direction are arranged crosswise; and
    the light-emitting units are connected to one of the conductors by at least one of the first wirings.

3. The light-emitting diode panel according to claim 2, wherein the first area comprises a first sub-area, a second sub-area positioned on one side of the first sub-area, and a third sub-area positioned on another side of the first sub-area; the through-holes comprise a plurality of first through-holes and a plurality of second through-holes, the first through-holes are defined at a junction of the first sub-area and the second sub-area, and the second through-holes are defined at a junction of the first sub-area and the third sub-area; and the conductors comprise first conductors disposed in the first through-holes and second conductors disposed in the second through-holes; and
    the light-emitting units disposed in the second sub-area are electrically connected to the first conductors, the light-emitting units disposed in the third sub-area are electrically connected to the second conductors, and the light-emitting units disposed in the first sub-area are electrically connected to the first conductors or the second conductors.

4. The light-emitting diode panel according to claim 1, wherein the first area comprises a first sub-area and a second sub-area positioned on one side of the first sub-area; the through-holes comprise a plurality of first through-holes and a plurality of second through-holes, and the first through-holes and the second through-holes are arranged along a first direction; and the conductors comprise first conductors disposed in the first through-holes and second conductors disposed in the second through-holes;
    the first through-holes and the second through-holes are defined at a junction of the first sub-area and the second sub-area; and
    the light-emitting units disposed in the first sub-area are electrically connected to the first conductors by at least one of the first wirings, and the light-emitting units disposed in the second sub-area are electrically connected to the second conductors by at least another one of the first wirings.

5. The light-emitting diode panel according to claim 3, wherein the first through-holes and the second through-holes are misaligned in the second direction.

6. The light-emitting diode panel according to claim 4, wherein the first through-holes and the second through-holes are arranged alternatingly along the first direction.

7. The light-emitting diode panel according to claim 1, wherein the at least one light-emitting diode is a sub-millimeter light-emitting diode or a micro light-emitting diode.

8. A spliced panel, spliced by at least two light-emitting diode panels, wherein each light-emitting diode panel is the light-emitting diode panel as claimed in claim 1.

9. The spliced panel according to claim 8, wherein the light-emitting units and the through-holes are arranged along a first direction, respectively, the through-holes and at least a part of the light-emitting units are arranged alternatingly along a second direction, and the first direction and the second direction are arranged crosswise; and
    the light-emitting units are connected to one of the conductors by at least one of the first wirings.

10. The spliced panel according to claim 9, wherein the first area comprises a first sub-area, a second sub-area positioned on one side of the first sub-area, and a third sub-area positioned on another side of the first sub-area; the through-holes comprise a plurality of first through-holes and a plurality of second through-holes, the first through-holes are defined at a junction of the first sub-area and the second sub-area, and the second through-holes are defined at a junction of the first sub-area and the third sub-area; and the conductors comprise first conductors disposed in the first through-holes and second conductors disposed in the second through-holes;
    the light-emitting units disposed in the second sub-area are electrically connected to the first conductors, the light-emitting units disposed in the third sub-area are electrically connected to the second conductors, and the light-emitting units disposed in the first sub-area are electrically connected to the first conductors or the second conductors.

11. The spliced panel according to claim 8, wherein the first area comprises a first sub-area and a second sub-area positioned on one side of the first sub-area; the through-holes comprise a plurality of first through-holes and a plurality of second through-holes, and the first through-holes and the second through-holes are arranged along a first direction; and the conductors comprise first conductors disposed in the first through-holes and second conductors disposed in the second through-holes;

the first through-holes and the second through-holes are defined at a junction of the first sub-area and the second sub-area; and the light-emitting units disposed in the first sub-area are electrically connected to the first conductors by at least one of the first wirings, and the light-emitting units disposed in the second sub-area are electrically connected to the second conductors by at least another one of the first wirings.

12. The spliced panel according to claim 11, wherein the first through-holes and the second through-holes are arranged alternatingly along the first direction.

13. The spliced panel according to claim 8, wherein the at least one light-emitting diode is a sub-millimeter light-emitting diode or a micro light-emitting diode.

14. The light-emitting diode panel according to claim 1, wherein the second wirings are connected between the substrate and the at least one flexible circuit board in a thickness direction of the substrate.

15. The light-emitting diode panel according to claim 1, wherein each of the second wirings is connected to one of the conductors, and lengths of the second wirings gradually decrease in a direction from edge areas of two opposite ends of the substrate to a middle area of the substrate.

16. The light-emitting diode panel according to claim 15, wherein shapes of the conductors connected to the second wirings in the middle area are circular, and shapes of the conductors connected to the second wirings in the edge areas are rectangular.

17. The light-emitting diode panel according to claim 1, wherein each of the second wirings is connected to one of the conductors, and lengths of the second wirings gradually decrease in directions from edge areas of two opposite ends of the substrate to a middle area of the substrate, respectively; and each of the second wirings comprises a connecting segment, a middle segment, and a bonding segment connected to each other in sequence, the connecting segment is connected to the conductors, and the bonding segment is connected and bonded to the at least one flexible circuit board;

wherein a width of the connecting segment of one of the second wirings disposed in the edge areas is greater than a width of the connecting segment of one of the second wirings disposed in the middle area; extension directions of bonding segments of two adjacent second wirings are parallel, and widths of the bonding segments of the two adjacent second wirings are equal;

for one of the second wirings disposed in the edge areas, an extension direction of the middle segment respectively intersects with an extension direction of the connecting segment and an extension direction of the bonding segment, and a width of the connecting segment is greater than a width of the bonding segment; and a width of the middle segment decreases in a direction from the connecting segment towards the bonding segment; and for one of the second wirings disposed in the middle area, a width of the connecting segment, a width of the middle segment, and a width of the bonding segment are equal.

18. The light-emitting diode panel according to claim 1, wherein a material of the conductors is solder or the conductors are nano gold wires.

19. A light-emitting diode panel comprising:
a substrate comprising a first area and a second area positioned on a peripheral side of the first area, wherein the substrate is provided with a plurality of through-holes;
a plurality of conductors, wherein one of the conductors is disposed in one of the through-holes;
a plurality of light-emitting units disposed on the substrate and corresponding to the first area, wherein one of the light-emitting units comprises at least one light-emitting diode;
a plurality of first wirings disposed on the substrate and connecting the at least one light-emitting diode to the conductors;
at least one flexible circuit board disposed on a surface of the substrate away from the light-emitting units; and
a plurality of second wirings disposed on the surface of the substrate away from the light-emitting units and connecting the conductors to the at least one flexible circuit board;
wherein the through-holes are defined in the second area and comprise a plurality of first through-holes and a plurality of second through-holes, the first through-holes are defined on one side of the first area, and the second through-holes are defined on another side of the first area; and the conductors comprise first conductors disposed in the first through-holes and second conductors disposed in the second through-holes;
the first through-holes and the second through-holes are arranged along a first direction, respectively, the light-emitting units are arranged along the first direction and a second direction, and the first direction and the second direction are arranged crosswise; and
in each row of the light-emitting units, a part of the light-emitting units is connected to one of the first conductors by the first wirings, and another part of the light-emitting units is connected to one of the second conductors by the first wirings.

20. A light-emitting diode panel comprising:
a substrate comprising a first area and a second area positioned on a peripheral side of the first area, wherein the substrate is provided with a plurality of through-holes;
a plurality of conductors, wherein one of the conductors is disposed in one of the through-holes;
a plurality of light-emitting units disposed on the substrate and corresponding to the first area, wherein one of the light-emitting units comprises at least one light-emitting diode;
a plurality of first wirings disposed on the substrate and connecting the at least one light-emitting diode to the conductors;
at least one flexible circuit board disposed on a surface of the substrate away from the light-emitting units; and
a plurality of second wirings disposed on the surface of the substrate away from the light-emitting units and connecting the conductors to the at least one flexible circuit board;
wherein the through-holes are defined in the second area and comprise a plurality of first through-holes and a plurality of second through-holes, the first through-holes are defined on one side of the first area, and the second through-holes are defined on another side of the first area; and the conductors comprise first conductors disposed in the first through-holes and second conductors disposed in the second through-holes;
the first through-holes are arranged along a first direction, the second through-holes are arranged along a second direction, the light-emitting units are arranged along the first direction and the second direction, and the first direction and the second direction are arranged crosswise; and a part of the light-emitting units is connected to one of the first conductors by the first wirings, and another part of the light-emitting units is connected to one of the second conductors by the first wirings.

* * * * *